United States Patent
Mazzillo et al.

(10) Patent No.: US 9,121,766 B2
(45) Date of Patent: Sep. 1, 2015

(54) MULTI PIXEL PHOTO DETECTOR ARRAY OF GEIGER MODE AVALANCHE PHOTODIODES

(75) Inventors: Massimo Cataldo Mazzillo, Corato (IT); Delfo Nunziato Sanfilippo, Catania (IT); Giovanni Condorelli, Misterbianco (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 1021 days.

(21) Appl. No.: 13/233,172

(22) Filed: Sep. 15, 2011

(65) Prior Publication Data
US 2012/0068050 A1 Mar. 22, 2012

(30) Foreign Application Priority Data
Sep. 16, 2010 (IT) .............................. VA2010A0069

(51) Int. Cl.
*H01L 31/107* (2006.01)
*G01J 1/46* (2006.01)
*H01L 27/146* (2006.01)

(52) U.S. Cl.
CPC ............. *G01J 1/46* (2013.01); *H01L 27/14658* (2013.01); *H01L 31/107* (2013.01)

(58) Field of Classification Search
CPC .................... H01L 29/0626; H01L 29/66113; H01L 31/02027; H01L 31/107
See application file for complete search history.

(56) References Cited

U.S. PATENT DOCUMENTS

| | | | |
|---|---|---|---|
| 6,188,056 B1 * | 2/2001 | Kalnitsky et al. | 250/208.1 |
| 2009/0256223 A1 * | 10/2009 | Yamamura et al. | 257/432 |
| 2010/0148040 A1 | 6/2010 | Sanfilippo et al. | 250/214.1 |
| 2010/0271108 A1 | 10/2010 | Sanfilippo et al. | |
| 2011/0272561 A1 | 11/2011 | Sanfilippo et al. | |

OTHER PUBLICATIONS

Neri et al., "Design and characterization of single photon avalanche diodes arrays," Nuclear Instruments and Methods in Physics Research A 617, May 11, 2010, pp. 432-433.
Hughes et al., "Tiled Silicon Photomultipliers for large area, low light sensing applications," Proceedings of SPIE, vol. 6471, Jan. 1, 2007, pp. 647112-1-647112-8.
Mazzillo et al., "Silicon Photomultipliers for nuclear medical imaging applications," Proceedings of SPIE, vol. 7003, Jan. 1, 2008, pp. 700301-1-700301-11.

* cited by examiner

*Primary Examiner* — Jae Lee
(74) *Attorney, Agent, or Firm* — Allen, Dyer, Doppelt, Milbrath & Gilchrist, P.A.

(57) ABSTRACT

A multi-pixel photodetector array may include a semiconductor substrate having a back side and a front side, Geiger mode avalanche photodiodes (GM-APDs) on the semiconductor substrate, each including an anode contact, and a common cathode for the GM-APDs and having a first connection lead on the backside of the semiconductor substrate. The multi-pixel photodetector array may include a second connection lead, and a common anode on the front side of the semiconductor substrate and configured to couple in common the anode contacts of the GM-APDs to the second connection lead. Each GM-APD may be configured to generate, when a photon impinges thereon, a current pulse of different shape for discrimination by an external circuit connected to the common cathode and the common anode.

20 Claims, 8 Drawing Sheets

MULTI PIXEL PHOTO DETECTOR ARRAY OF GEIGER MODE AVALANCHE PHOTODIODES

FIELD OF THE INVENTION

The present disclosure relates to semiconductor photodetectors and, more precisely, to an array of Geiger-mode avalanche photodiodes.

BACKGROUND OF THE INVENTION

Photosensors made of semiconductor materials have gained attention in recent years because they may be specially adapted for the needs of many optical applications. See D. Renker, Properties of avalanche photodiodes for applications in high energy physics, astrophysics and medical imaging, Nuclear Instrumentation and Methods A, 486, pp. 164-169, (2002); S. Vasile, P. Gothoskar, R. Farrell and D. Sdrulla, Photon detection with high gain avalanche photodiode arrays, IEEE Transactions on Nuclear Science, 45(3), pp. 720-723, (1998); B. F. Aull, A. H. Loomis, D. J. Young, R. M. Heinrichs, B. J. Felton, P. J. Daniels, and D. J. Landers, Geiger-Mode Avalanche Photodiodes for Three-Dimensional Imaging, Lincoln Laboratory Journal, 13(2), pp. 335-350, (2002); J. C. Jackson, D. Phelan, A. P. Morrison, R. M. Redfern, and A. Mathewson, Towards integrated single photon counting microarrays, Optical Engineering. 42(1), pp. 112-118, (2003); C. Niclass, A. Rochas, P.-A. Besse, and E. Charbon, Design and characterization of a CMOS 3-D image sensor based on single photon avalanche diodes, IEEE Journal of Solid-State Circuits, 40(9), pp. 1847-1854, (2005); F. Zappa, A. Gulinatti, P. Maccagnani, S. Tisa, and S. Cova, SPADA: Single Photon Avalanche Arrays, IEEE Photonics Technology Letters, 17(3) pp. 657-659, (2005); E. Sciacca, S. Lombardo, M. Mazzillo, G. Condorelli, D. Sanfilippo, A. Contissa, M. Belluso, F. Torrisi, S. Billotta, A. Campisi, L. Cosentino, A. Piazza, G. Fallica, P. Finocchiaro, F. Musumeci, S. Privitera, S. Tudisco, G. Bonanno, and E. Rimini, Arrays of Geiger mode Avalanche Photodiodes, IEEE Photonics Technology Letters, 18(15), pp. 1633-1635, (2006); and F. Zappa, S. Tisa, A. Tosi and S. Cova, Principles and features of single photon avalanche diode arrays, Sensors and Actuators A 140, pp. 103-112. (2007).

Due to their properties, photon counting detectors have found widespread use for the detection of very weak and fast optical signals in many fields like astronomy, fluorescence and luminescence decay measurements, single-molecule detection and laser ranging. (M. Ghioni, S. Cova, F. Zappa, and C. Amori, Compact active quenching circuit for fast photon counting with avalanche photodiodes, Review Scientific Instruments, 67(10), pp. 3440-3448, (1996)).

Silicon photomultipliers (SiPM) are semiconductor photodetectors operated in a limited Geiger mode. The SiPM structure is based on a two-dimensional pixel array of Geiger mode Avalanche Photodiodes (GM-APD) that individually act as photon counters. In Geiger mode, each pixel (photodiode) is operated with a bias voltage above its breakdown voltage. At this operating condition, the electric field within the GM-APD depletion layer is high enough that charge carriers injected in this region may trigger a self-sustaining avalanche multiplication process by impact ionization mechanisms.

When a photon is absorbed in the depletion layer of the diode, a photo electron-hole pair is generated. This pair may initiate the breakdown current. As a result, a sharp current pulse of few milliamps and with sub-nanosecond rise time is produced. The current rising edge marks the photon arrival time. In Geiger mode, photodiodes work as binary devices, because they give the same output signal regardless of the number of interacting photons. (E. Sciacca, A. C. Giudice, D. Sanfilippo, F. Zappa, S. Lombardo, R. Cosentino, C. Di Franco, M. Ghioni, G. Fallica, G. Bonanno, S. Cova, and E. Rimini, Silicon planar technology for single-photon optical detectors, IEEE Transactions on Electron Devices, 50(4), pp. 918-925, (2003)).

In a SiPM, the current flow throughout each pixel (photodiode) is limited by integrated individual quenching resistors, which turn off the avalanche current and reset each fired diode. In SiPM configuration, each diode is connected to the power supply through an integrated large series ballast resistor Rq (typical values in the range 100 kΩ-3MΩ). (P. Buzhan, B. Dolgoshein, L. Filatov, A. Ilyin, V. Kantzerov, V. Kaplin, A. Karakash, F. Kayumov, S. Klemin, E. Popova, and S. Smirnov, Silicon photomultiplier and its possible applications, Nuclear Instrumentation and Methods A, 504, pp. 48-52, (2003)).

In a SiPM, the outputs of all the pixels are multiplexed; therefore, it is not possible to localize the pixels fired by the absorption of photons. This drawback may limit the performance of this device and make its use possible only in applications where it is important only to determine the number of photons impinging on the detector surface, regardless of their point of absorption.

Figure 5:
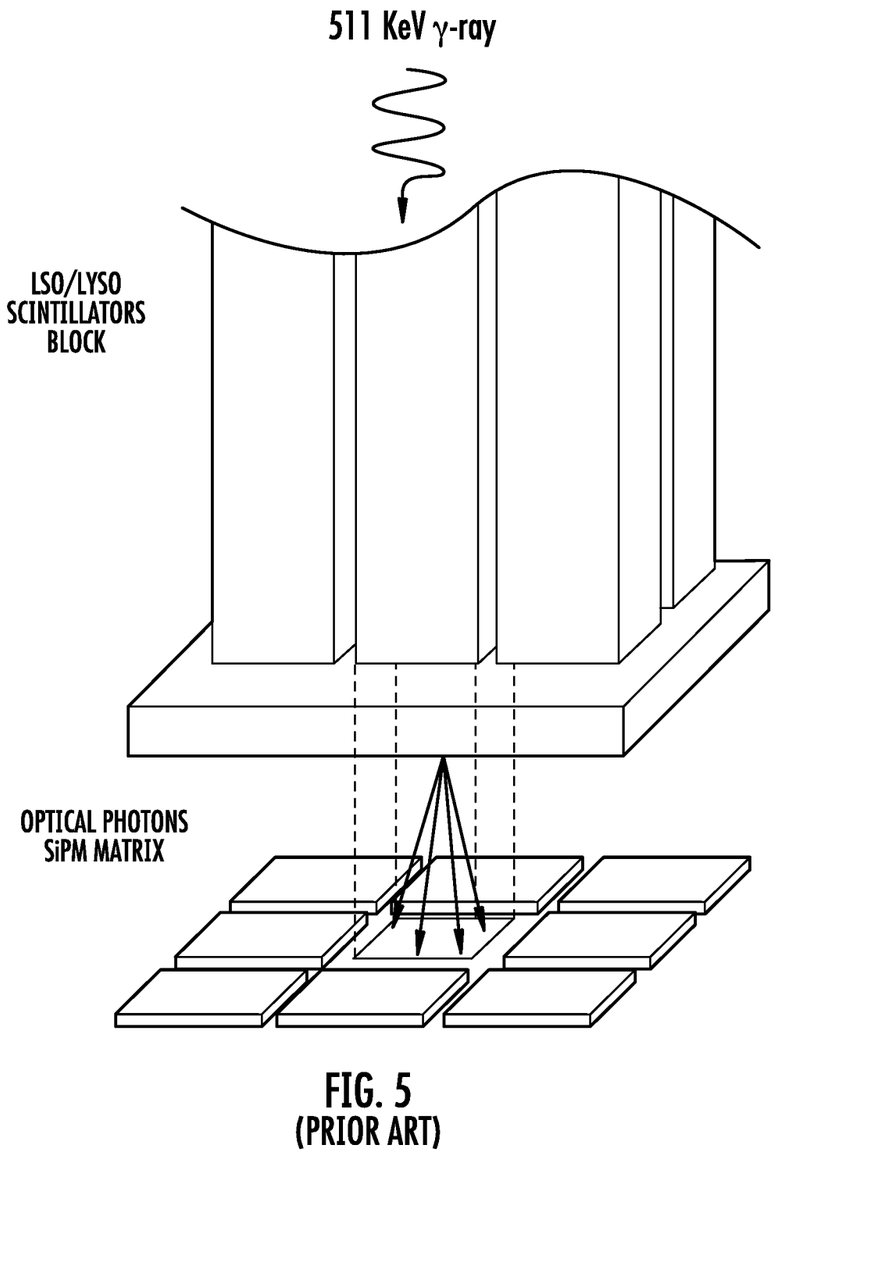
FIG. 5 illustrates a block of optically isolated scintillators coupled to an array of independent SiPMs in PET application, according to the prior art.

Typically, to overcome this limitation in applications like Positron Emission Tomography (PET), several Photomultiplier Tubes (PMTs) or SiPMs are tiled together to form along with a two-dimensional array of scintillating crystals a unique block detector, as shown in FIG. 5. In PET applications, the crystals in the scintillator block are usually optically isolated from each other, and each scintillator is coupled to a SiPM with size comparable to the transverse dimensions of the coupled crystal.

When a gamma-photon is incident on one of the crystals, the resultant light may be conveyed within the same crystal if the scintillators in the block are optically isolated or shared by the different scintillators otherwise. Information on the position of the detecting crystal may be obtained from the detector outputs by using complex position reconstruction algorithms if the light emitted by the scintillators is shared among different detectors, as it is typical of tiled arrays coupled to scintillators that are not optically isolated. On the other hand, also in the case where the scintillators are isolated and coupled to independent detectors, it is helpful to have independent anode and cathode outputs for each one of the SiPMs within the array to determine the gamma-ray impinging position on the scintillator block. However, the spatial resolution allowed with this technique may be poor due the limited number of detectors that may be tiled together because of the complexity of the electronics, packaging constraints, the finite dimension of the same detectors required to obtain a measurable signal at their outputs, and the limited fill factor of the whole tiled array.

This requirement may also be important in imaging arrays using GM-APD pixels as sensitive elements to exploit fast response of these detectors in LIDAR techniques. To provide adequate spatial information without using readout scanning techniques, individual outputs with appropriate driving and readout circuits for each pixel of the array may be required. Obviously the larger the number of pixels in the array, the higher its dynamic range, and consequently, the more accurate the spatial information provided by the whole photodetector. Moreover the higher the whole dimension and the geometrical fill factor of the array, the higher its sensitivity. However, because of packaging constraints and the reduction of the fill factor due to the individual pixels outputs, arrays with a reduced number of pixels (typically 1000) may only be realized by using this approach.

SUMMARY OF THE INVENTION

Multiplexing of array pixel information to communicate with the external circuits through a limited number of leads of a semiconductor integrated sensor device is accomplished in an effective and efficient manner in a multi pixel photo detector array of Geiger mode avalanche photodiodes disclosed herein.

Figure 10:
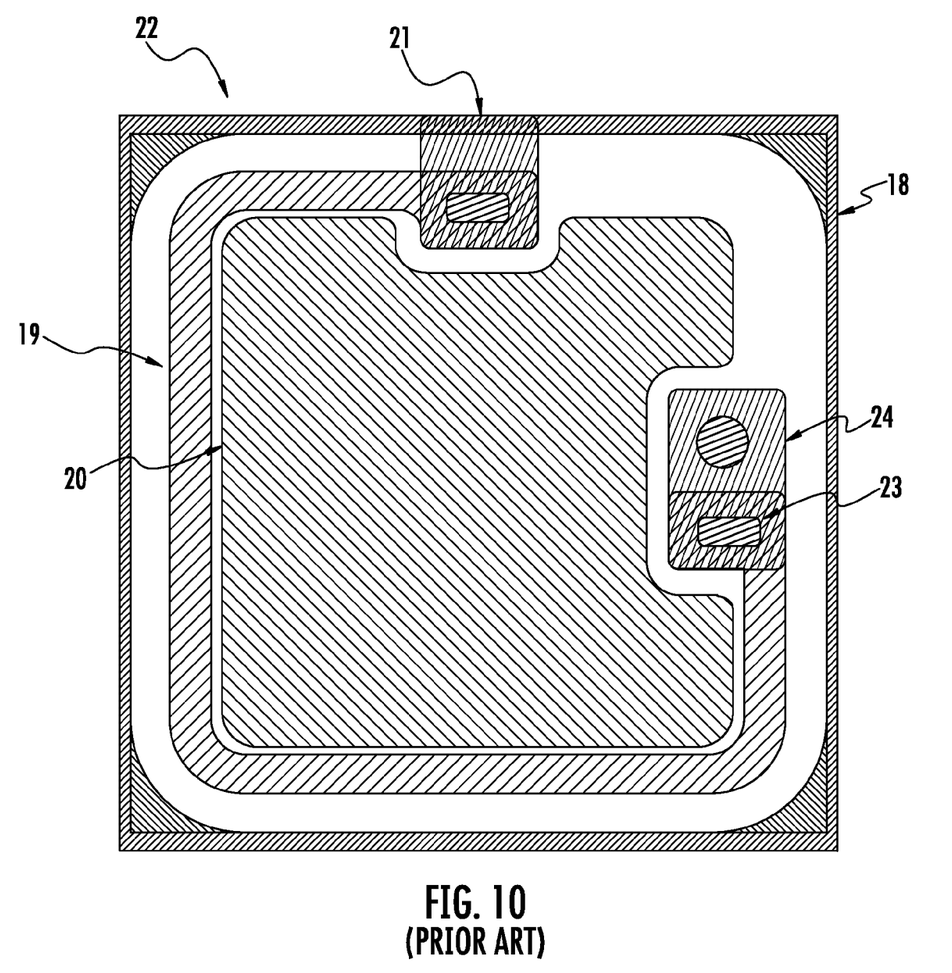
FIG. 10 is a Geiger mode avalanche photodiode, according to the prior art.

The elementary sensing structure of the multi pixel, photo detector array of the present disclosure may comprise a Geiger mode avalanche photodiode. Among the Geiger mode avalanche photodiodes that may be used, it is worth mentioning the photodiode disclosed in Italian patent application No. VA2010A000026, shown in FIG. 10, and Italian patent application No. TO2009A000322, each assigned to the present application's assignee, the contents of which are hereby incorporated by reference in their entirety.

An aspect of the multi pixel, photo detector array of this disclosure may be that all the parts or portions of a unique distributed anode contact of all the distinct elementary sensing structures of the multi pixel array are connected to a common anode current collecting grid, which is patterned in a front metallization layer in a way as to have a minimal foot-print over the front area of the photo detector array. Also, all of the elementary sensing structures of the multi pixel array may share a common rear cathode contact. Thus, such a two-terminal, multi pixel, photo detector array may multiplex the individual pixel information through a common anode and a common cathode contact.

Discrimination among the information coming from the array pixels in terms of location of the pixel on which the incident photon impinges is made possible by realizing the Geiger mode photodiodes with different characteristics such to generate current pulses of different shape adapted to discrimination by an external circuitry connected to the common cathode and anode contacts.

According to an embodiment, the current pulse responses may be made different by realizing the photodiodes of the array such that each photodiode has a quenching resistor different from any of the other photodiodes of the array.

DETAILED DESCRIPTION OF THE PREFERRED EMBODIMENTS

In the description herein, it is presumed that the photons impinge on only one pixel of the array at the time, i.e. only one pixel at the time is impinged by photons. In practice, it is assumed that the flux of photons has a cross-section sufficiently small to excite a single pixel.

For example, in an array of scintillation detectors, an elementary particle (e.g. a gamma ray) is absorbed by only one detector at the time. When the detector absorbs an elementary particle, it emits a photon flux usually in the visible range. By associating a pixel of the array of this disclosure to each scintillation detector, it is possible to identify the detector that has captured the elementary particle by recognizing in terms of relative intensity of response the pixel that captured the emitted photons.

A two terminal position sensitive multi-pixel photodetector array of Geiger mode avalanche photodiodes is disclosed. According to an aspect of this disclosure, each photodiode is characterized by a different current response to the absorption of impinging photons. In practice, when photons impinge on a photodiode, it generates a current pulse of different shape in respect to the current pulse generated by any other photodiode of the array. In this way, it is made possible to discriminate among the current pulses collected on a same cathode and anode lines and identify the pixel hit by the photon.

There are numerous ways of differentiating the current response of the photodiodes among them. For example, this may be done by varying the optical response of the different photodiodes obtained for instance by realizing pixels with different depletion layer thickness and/or different combination of antireflective coating layers on the surface directly exposed to the luminous flux.

Therefore, the spatial information is provided by the different current response produced by a pixel or group of pixels to the impinging photon flux and this makes it not necessary to have an independent output for each pixel of the array, as in the case of typical photodetector arrays for imaging applications. As a consequence, the anode and cathode contacts of all the pixels may be multiplexed by using common anode and cathode metallizations.

The possibility to realize a photodetector array for imaging with only two outputs entails a simpler driving and readout circuitry for the device. In fact, for its proper working, such a device may need only one biasing and readout circuit which could be external or integrated in the same photosensor chip. This in turn may allow using simpler approaches for the packaging of the device.

Moreover, as it is evident, by using this approach, a multiplexed contact photodetector array for imaging comprising an arbitrarily large number of pixels may be realized to improve the array's dynamic range. Furthermore this device presents a higher fill factor due to the reduction of the dead space because in this case, it is not necessary to have an independent anode output for each pixel as in typical imaging arrays. This advantage is particularly helpful for arrays with a high number of pixels. Finally, the array may be designed in order to group the pixels such that one or more pixels adjacent or displaced in different positions of the matrix have the same current response and consequently produce current pulses of the same shape when an avalanche event is triggered by photo or thermal generation. This approach may be helpful, provided that the diameter of the optical beam incident on the array is smaller than the size of the pixel or group of pixels with different current response. This approach may be used also in the case where each sensitive element in the imaging array is in turn a GM-APD array, for example, SiPMs in tiled arrays for the aforementioned PET application.

A simple way of differentiating the current responses is described hereinbelow. It has been previously pointed up that the integrated charge at the SiPM output depends on the quenching resistor value. Hence, it would be possible to design pixels or groups of pixels with different quenching resistor values for making each photodiode or group of photodiodes generate current pulses of different shape when a photon is captured. These current pulses may be used to charge a capacitor, and the measured charge accumulated by the capacitor may be used to identify the position of the fired GM-APDs.

Figure 1:
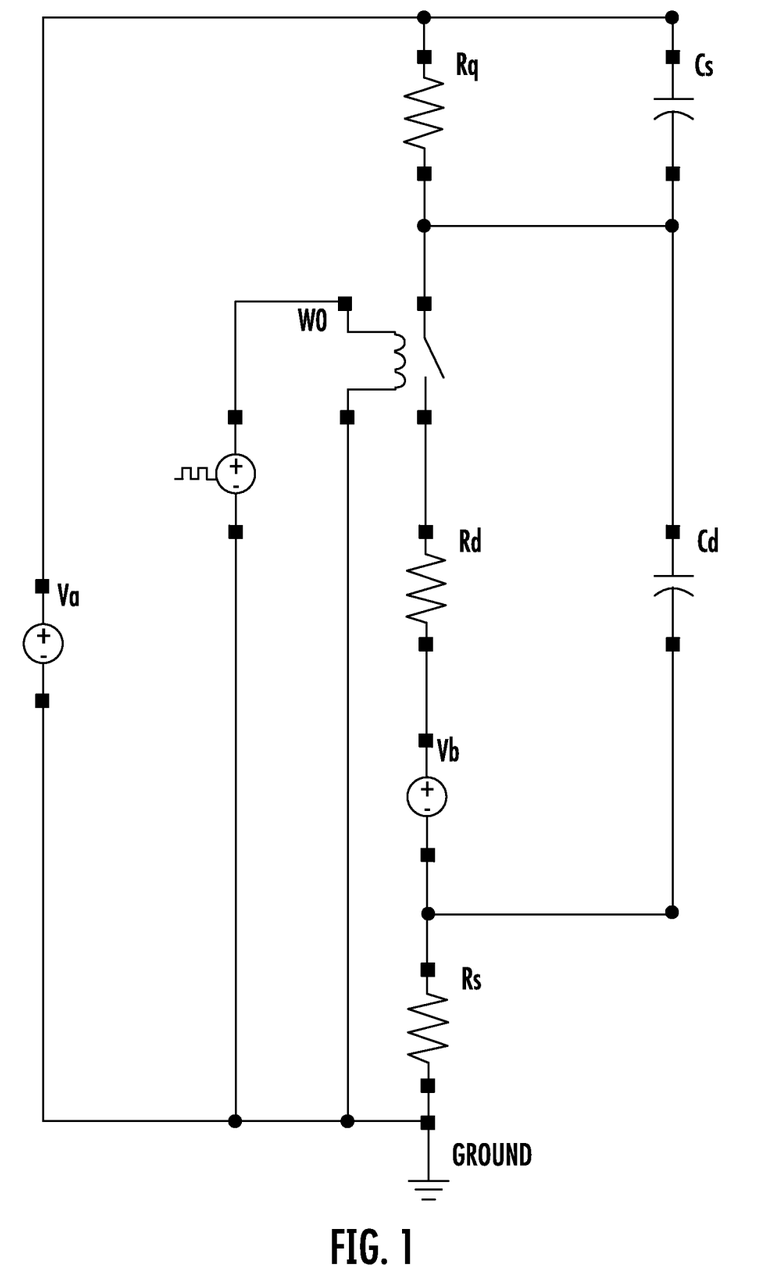
FIG. 1 depicts the equivalent quenching circuit of a GM APD, according to the present invention.

For a single GM-APD, the passive-quenching circuit (PQC) is shown in FIG. 1 together with its equivalent circuit: the GM-APD is reverse biased through a high-value ballast resistor Rq typically in the range (100 kΩ-3 MΩ). $R_S$ is a small sensing resistor, typically 50Ω (usually the internal impedance of an oscilloscope), which converts the fast current signal into a voltage signal that drives the comparator applied at node 2. $C_d$ is the junction capacitance (typically few hundreds of fF) and $C_S$ is the stray capacitance to ground (typically few pF). The diode resistance $R_d$ is given by the sum of the space-charge resistance and the Ohmic resistance of neutral regions crossed by the avalanche current. $V_B$ is the breakdown voltage and $V_A$ the bias voltage. When no current is flowing, the diode current $I_d$ is zero, and the diode bias voltage $V_d$ is equal to $V_A$ (reverse bias). Avalanche triggering (fired by a photon absorption or by a thermal generation) corresponds to closing the switch $W_O$ on the circuit in FIG. 1. In a few picoseconds, the current reaches the peak value, before the diode voltage has changed. Then, the high current flowing through the diode discharges the capacitors, and $I_d$ and $V_d$ decrease exponentially to the steady-state condition. (S. Tisa, F. Zappa, A. Tosi and S. Cova, Electronics for single photon avalanche diode arrays, Sensors and Actuators A 140, pp. 113-122. (2007)).

Figure 2:
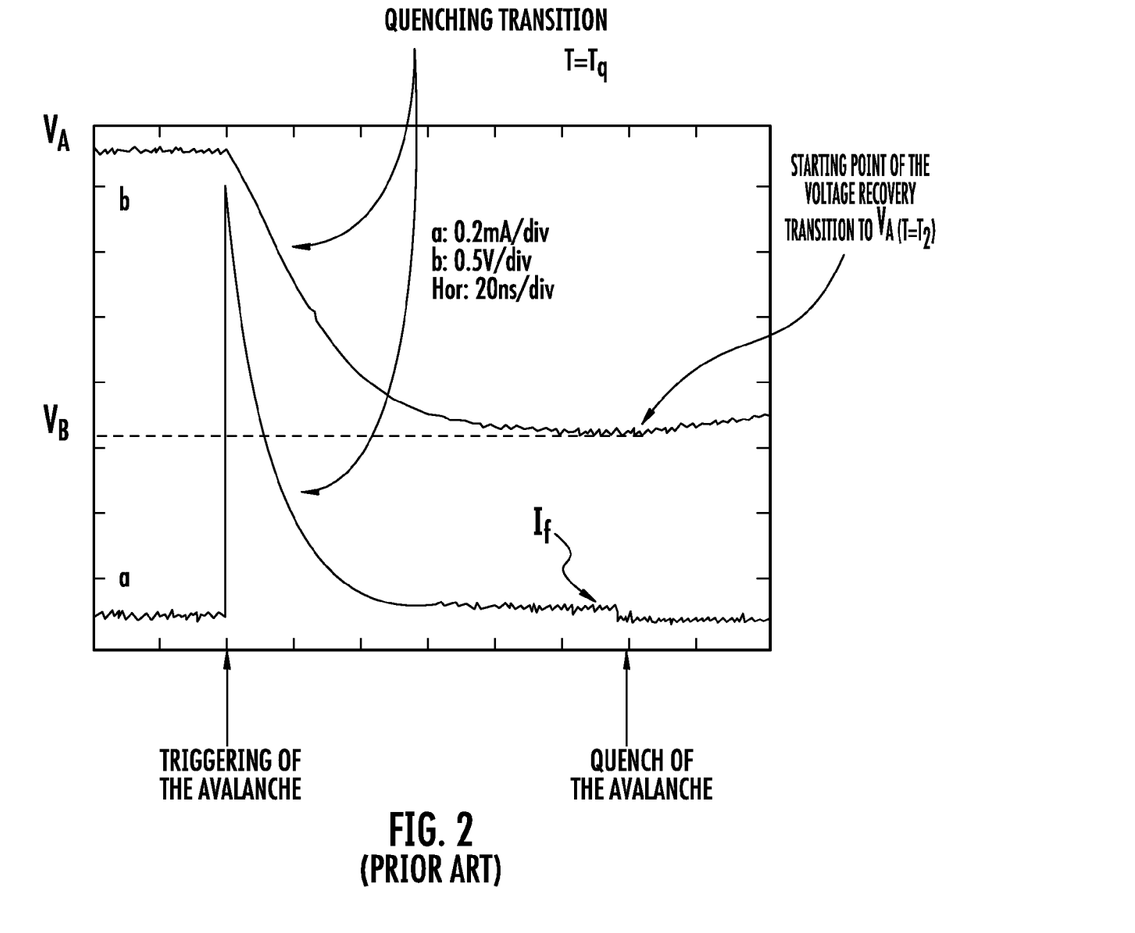
FIG. 2 are shapes of the voltage (top) and of the current output (bottom) of a GM-APD after the triggering of an avalanche event, according to the prior art. (S. Tisa, F. Zappa, A. Tosi and S. Cova, Electronics for single photon avalanche diode arrays, Sensors and Actuators A 140, pp. 113-122. (2007)).

After triggering, the current flowing in the photodiode as a function of time is given by:

$$I_d(t)=(V_d(t)-V_B)/R_d=VEX(t)\times R_d \quad (1)$$

where VEX(t) is the excess bias above breakdown at which the GM-APD is biased. FIG. 2 shows typical $I_d$ and $V_d$ waveforms. By solving the equivalent circuit in FIG. 1, with appropriate boundary conditions, the asymptotic steady-state values of current, $I_f$, and voltage, $V_f$, and the peak value of the avalanche current $I_d(0+)$ may be calculated:

$$I_d(0+)=(V_A-V_B)/R_d,\ I_f=(V_A-V_B)/(R_d+R_q)\approx VEX/R_q,$$
$$V_f=V_B+R_d\times I_f \quad (2)$$

The approximation is justified since for thin junction GM-APDs usually $R_q \gg R_d$.

The quenching time constant $\tau_q$ is set by the total capacitance $C_d+C_S$ and by the parallel of $R_d$ and $R_q$ (practically limited by $R_s$):

$$\tau_q=(C_d+C_s)R_q//R_d\approx (C_d+C_s)\times R_d \quad (3)$$

At low $I_f$, $V_f$ is very near to $V_B$ (see FIG. 2). When the decaying voltage $V_d(t)$ approaches $V_B$, the current $I_d(t)$ becomes low and as consequence the number of carriers that cross the avalanche region is small. The avalanche process is statistical such that there may be the probability that none of the carriers crossing the depleted region impact ionize. The probability of zero-multiplied carriers becomes significant when the diode current $I_d$ falls below about few tens of μA (typically 100 μA), and rapidly increases as Id further decreases. This threshold current is known as latching current $I_L$. Therefore, the avalanche process is self-sustaining if the steady state current level is above the latching value, otherwise the process self-quenches. The latching current value $I_L$ limits the range of excess bias values that may be applied to the device, once the value of the quenching resistor $R_q$ is fixed. In fact, the maximum excess bias value $V_{EMax}$ that may be applied in order to properly quench the avalanche current is given by:

$$V_{EMax}=V_B+R_qI_L \quad (4)$$

When the diode self-quenches, the switch $W_0$ in FIG. 1 opens and the capacitors slowly recharge to $V_A$, with an exponential recovery transition with time constant:

$$\tau_r\approx (C_d+C_s)\times R_q \quad (5)$$

The recovery transition is slow because the time constant is dominated by $R_q$, which is very high with respect to $R_d$. Typical values for $\tau_r$ are of a few tens of ns while those $\tau_q$ are of a few ns. (S. Tisa, F. Zappa, A. Tosi and S. Cova, Electronics for single photon avalanche diode arrays, Sensors and Actuators A 140, pp. 113-122. (2007)).

Hence, once the avalanche current is quenched, the diode slowly recovers toward the quiescence bias voltage with a time constant $\tau_r$, so that it takes ~5$\tau_r$ to recover to the correct excess bias within 1%. During recovery, the diode voltage $V_d(t)$ exponentially increases above $V_B$. A photon that arrives during the very first part of recovery is almost certainly lost, since the avalanche triggering probability is proportional to the excess bias value that is almost negligible. Instead, subsequent photons have a progressively higher probability to trigger the GM-APD. (S. Tisa, F. Zappa, A. Tosi and S. Cova, Electronics for single photon avalanche diode arrays, Sensors and Actuators A 140, pp. 113-122. (2007)). The GM-APD detection efficiency increases with the excess bias due to the increase of the avalanche triggering probability.

One parameter is the total charge $Q_pc$ in the avalanche pulse. This quantity is related to the asymptotic current $I_f$ and recovery time constant $\tau_r$ as $$Q_{pc}=e\times G=(V_A-V_f)\times (C_d+C_s)\approx V_{EX}\times (C_d+C_s)\approx I_f\times \tau_r \quad (6)$$

where e is the electron elementary charge and G is the GM-APD gain. Thus, the higher the quenching resistor value, the higher also the quantity of charge flowing in the device. (S. Tisa, F. Zappa, A. Tosi and S. Cova, Electronics for single photon avalanche diode arrays, Sensors and Actuators A 140, pp. 113-122. (2007)).

Figure 3:
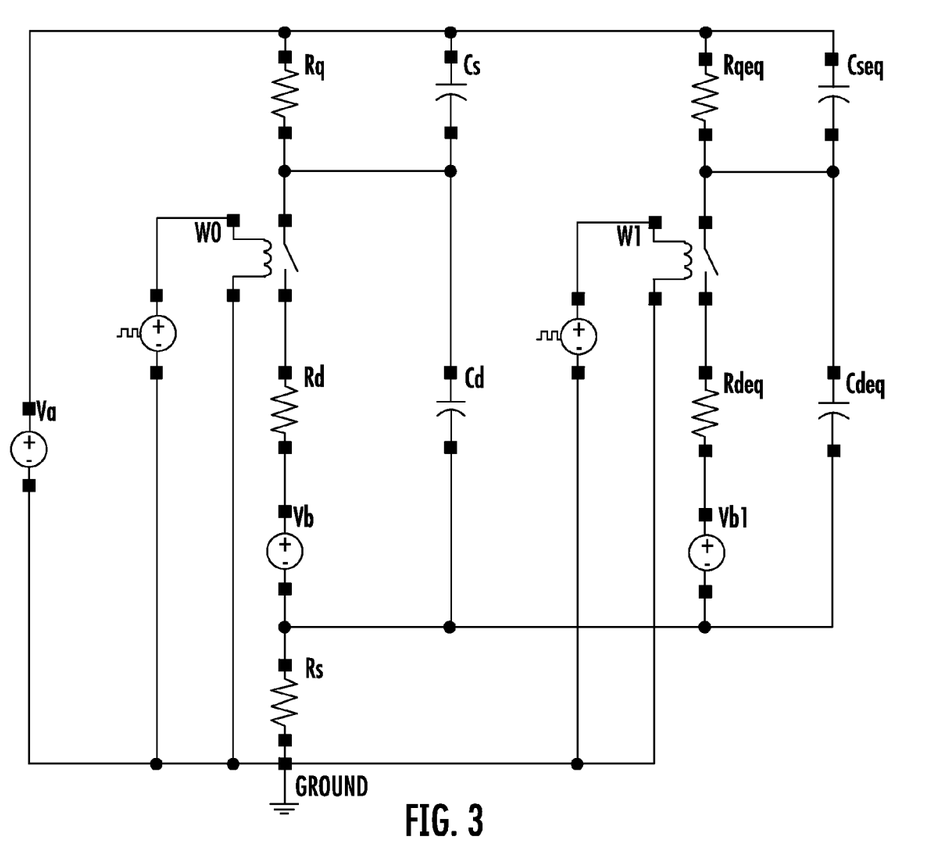
FIG. 3 is an equivalent quenching circuit of a SiPM, according to the present invention.

The GM-APD model described above may be also used to simulate the SiPM behavior. This last device is an array of N GM-APD and its electrical model circuit is shown in FIG. 3, obtained by adding to the GM-APD model of FIG. 1 the right side part that represents the equivalent load due to the N-1 switched off SiPM cells. Since the circuit elements are resistances and capacitances, the values of $R_{qeq}$, $C_{seq}$, $R_{deq}$ and $C_{deq}$ are obtained simply as the parallel of the N-1 single GM-APD elements.

Figure 4:
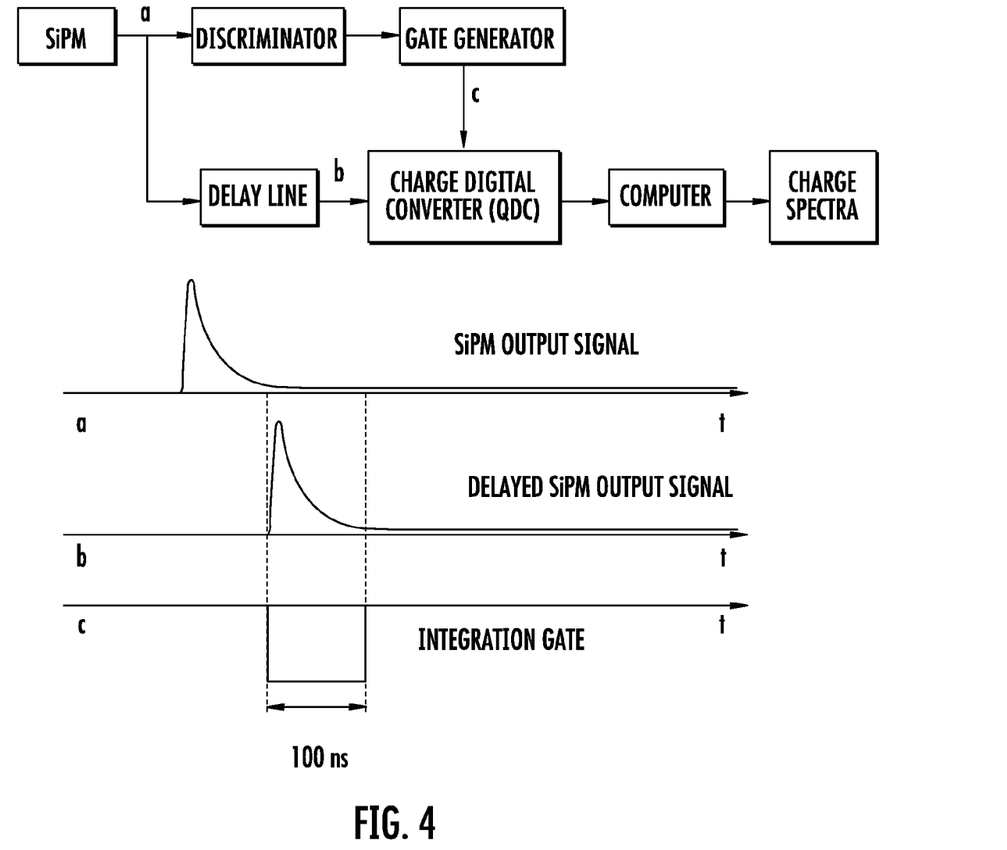
FIG. 4 illustrates an apparatus used to measure the charge produced at the SiPM output, according to the present invention.

The apparatus used to integrate the charge at the output of a SiPM is schematically illustrated in FIG. 4. The signal of the SiPM (usually coupled to LSO (Lutetium OxyOrthoSilicate)/LYSO (Lutetium-Yttrium OxyOrthosilicate) scintillators and connected to a preamplifier, is split into two pulses. One pulse is then directed to a discriminator with an appropriate threshold value and the other, suitably delayed, to a charge to digital converter (QDC).

The SiPM signals from the discriminator are sent to the gate module to provide a QDC trigger window of a few tens of nanoseconds or more. The other part of the signal is delayed before being sent to the QDC such that the onset of the avalanche pulse falls within the gate time window.

The QDC integrates the SiPM signal current received at one of the channel inputs during the gate window and converts it into a voltage. At the end of the window, an analog-to-digital converter reads the voltage with the least significant bit equal to typically few tens of femtocoulomb. The QDC is usually run by a PC using appropriate software.

Figure 6:
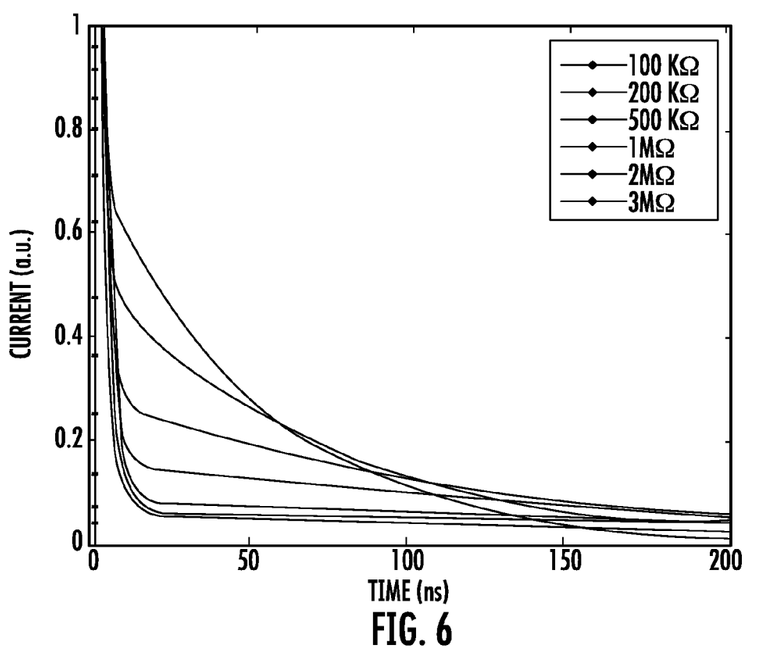
FIG. 6 depicts simulation output curves of SiPM arrays obtained with different quenching resistors of different value, according to the present invention.
Figure 7:
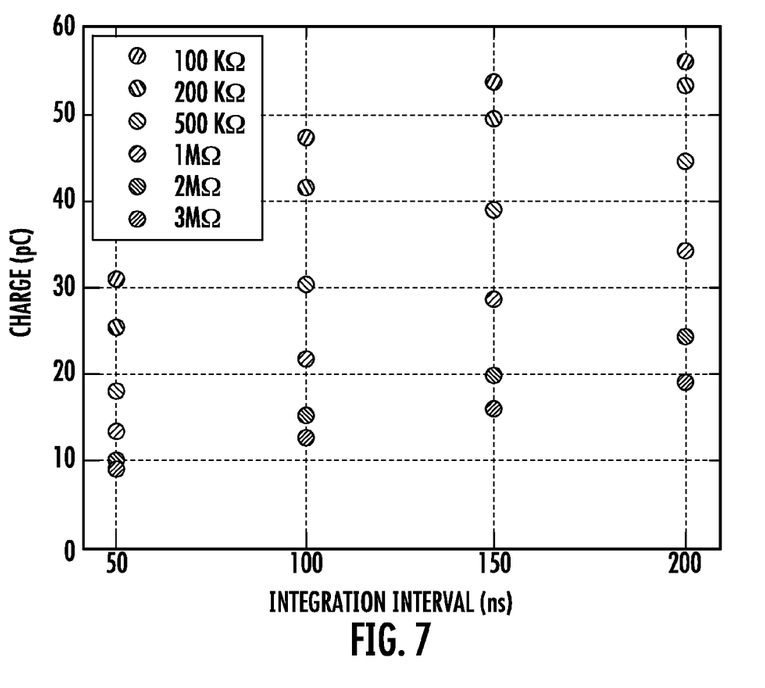
FIG. 7 is a graph of integrated charge calculated by simulation using different gate time window in SiPM arrays, which comprise a same number of microcells and quenching resistors of different values, according to the present invention.

Referring to the electric model reported in FIG. 3, FIG. 6 depicts the simulated SiPM outputs for quenching resistors of different values, and FIG. 7 the simulated average charge produced for different integration times by SiPMs with the same number of microcells (1000 in total of which 100 activated and 900 not fired) and quenching resistors of different values chosen in the range 100 kΩ-3 MΩ. The capacitance values used for the simulations are Cd=110 fF and Cs=10 fF, the Rd value is 800Ω while 3V-0V are applied to the array (BV=28V).

As it may be seen from the figure, for any fixed integration time, the variation of the average charge obtained on devices with different quenching resistor values is of the order of at least a few picocoulomb and may be easily discriminated by using typical QDC, which exhibits a resolution of only a few tens of femtocoulomb. Therefore, it is possible to realize, in a single SiPM with two terminals (anode and cathode), different regions characterized by different quenching resistor values and then use the characteristic reported in previous lines to discriminate the position of the cells fired by the absorption of photons inside the array.

Figure 8:
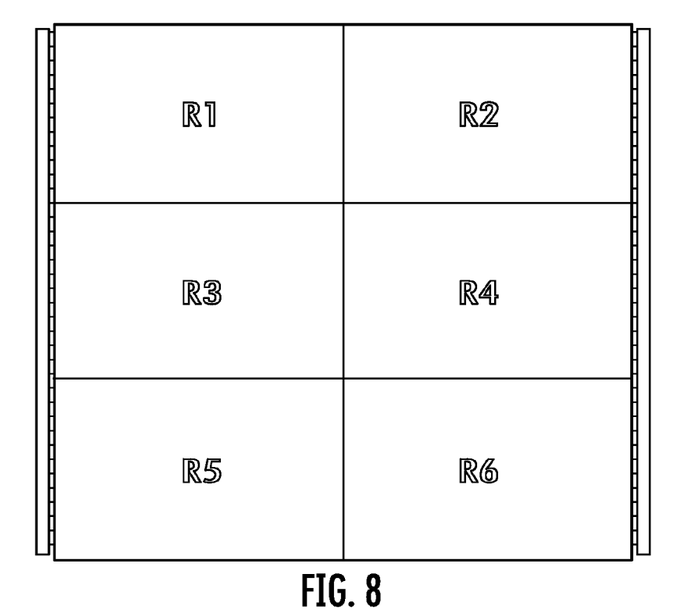
FIG. 8 is a two terminal SiPM characterized by 6 distinct regions with quenching resistors of different values, according to the present invention.
Figure 9:
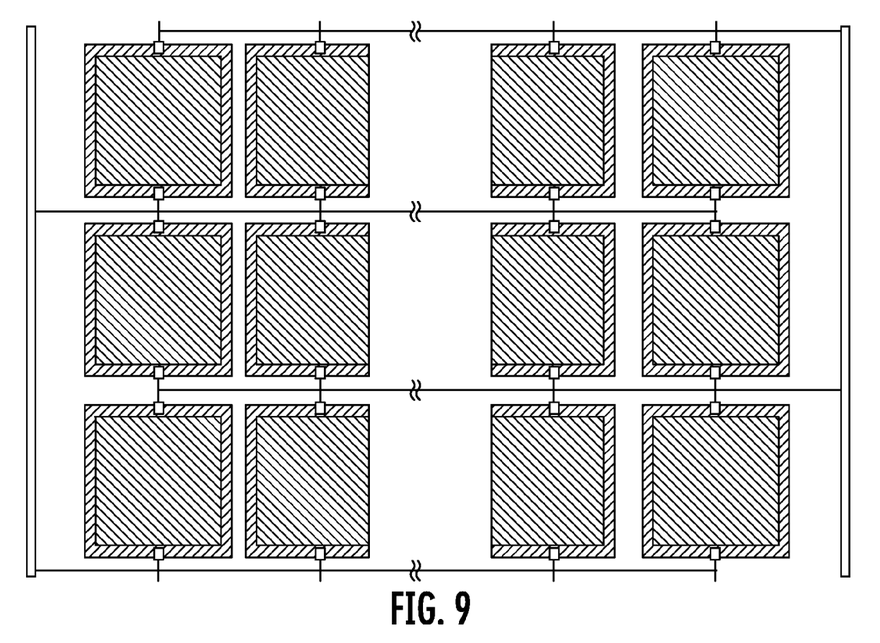
FIG. 9 is a interdigitated configuration of the anode and cathode metallizations in a SiPM, according to the present invention.

As an example, FIG. 8 depicts a single SiPM device with the six different quenching resistor values considered in FIG. 7. In FIG. 9, a detailed view of the device of FIG. 7 is shown, in which all the GM-APD cathodes are connected to the cathode pad by metal buses such as all the GM-APD anodes are connected to the anode pad by other metal buses. Besides, referring to each single GM-APD, the central square represents the GM-APD active area and the wide downward diagonal strip surrounding it represents the quenching resistors.

In FIGS. 8 and 9, the anode and cathode contacts are both on the front side of the array. Likewise the same approach disclosed herein may be applied to SiPM arrays with one of the two contacts on the bottom side of the device. In this last case, the position sensitive SiPM array would have a higher fill factor, due to the presence of the metallization grid of only one terminal on the chip side directly exposed to the incident photon flux.

Numerous techniques may be used to modulate the quenching resistor value. A simple approach includes using polysilicon layers with different doping connected to each pixel of the array. The doping modulation may be obtained by using implantation steps at different doses for the different pixels or group of pixels with distinct quenching resistor value and/or different thermal budgets to activate only a fraction of the implanted impurities. As it is evident in this case, once deposited, a series of implantation steps on the polysilicon layer at different doses have to be performed on different photoresist masks to selectively implant with the designed doping content only the regions in the array where quenching resistor with the designed value have to be realized.

A unique thermal process after all the implantation steps or distinct thermal processes after each implantation step may be used to electrically activate the implanted impurities. Referring to the structure in FIG. 8 and assuming a polysilicon layer of fixed length (44 squares) and thickness (5200 Å), in the following table, exemplary average boron implantation doses and final dopant concentrations and quenching resistor values after a thermal annealing of process of 1 hour at 920° C. are reported.

A fixed energy of 50 keV has been used for all the different implantations steps.

| Name | Dopant dose | Dopant concentration | Resistor value |
| --- | --- | --- | --- |
| R1 | 5e13 atoms/cm2 | 1.5e18 atoms/cm3 | 3 MΩ |
| R2 | 7.5e13 atoms/cm2 | 2.8e18 atoms/cm3 | 2 MΩ |
| R3 | 1e14 atoms/cm2 | 8.4e18 atoms/cm3 | 1 MΩ |
| R4 | 1.3e14 atoms/cm2 | 2.2e19 atoms/cm3 | 500 kΩ |
| R5 | 2.5e14 atoms/cm2 | 5.9e19 atoms/cm3 | 200 kΩ |
| R6 | 3.5e14 atoms/cm2 | 1.2e20 atoms/cm3 | 100 kΩ |

By using the same approach, it is possible to obtain different quenching resistor values by using common implantation steps and polysilicon layers of different lengths. This may considerably reduce the number of required photomask steps even if the fill factor of the array may be reduced by the presence of longer polysilicon strips.

The maximum number of quenching resistor values that could be used in a GM-APD array using the approach disclosed herein depends on many factors like the fraction between the number of activated and the total number of microcells in the array, the integration time used for QDC acquisitions and the technological constraints due to the methodology of realization of quenching resistors. Therefore, where the array has to be used, this number should be determined from time-to-time, taking into account all the above considerations.

As an example with reference to the case above (each SiPM comprises 1000 microcells in total of which 100 activated and supposing to use 200 ns as integration time), the charge distribution produced by the fired microcells is typically a Gaussian curve whose center and sigma respectively represent the average charge and the uncertainty in the charge produced by the array. At 3V-0V, assuming a typical value for the gain of about 3×106, 100 activated microcells produce an average charge of about 50 pC with a sigma which is typically of the order of 5% with respect to the average charge value (in this case about 2.5 pC). Assuming that two distinct charge distributions curves produced by two identical arrays with the same number of activated microcells but with a different quenching resistor value may be distinguished if the distance between their centers is lower than 2 sigma (in the case mentioned above lower than 5 pC) from simulation data similar to those shown in FIG. 7 it may be deduced that, if 3 MΩ is the highest considered quenching resistor value, the next allowed resistor values is about 2 MΩ. Therefore, in this specific case, in the range 100 kΩ-3 MΩ, from simulations, it may be deduced that about 8 different quenching resistor values could be allowed. It should be noted that the difference between two allowed adjacent resistor values is not fixed but increases at the high end of the considered quenching resistor values interval (in this specific case 3 MΩ).

Another equivalent approach to discriminate the single quenching resistor value could be by using a time-to-digital converter (TDC) instead of QDC. In fact, considering the total amount of the single pixel capacity in few hundreds of femtofarad, by using the same quenching resistor values reported above, the recharging times are in the range of 100 ns-3 µs with 100 ns of minimum resolution compared to the few picoseconds of minimum TDC resolution.

That which is claimed is:

1. A multi-pixel photodetector array comprising:
   a semiconductor substrate having a backside, a front side, and a metallization layer on the front side;
   a plurality of Geiger mode avalanche photodiodes (GM-APDs) on said semiconductor substrate and configured to perform imaging applications with monochromatic radiation, each GM-APD comprising an anode contact, and having a physical characteristic different from other GM-APDs and a position on said semiconductor substrate, the physical characteristic comprising a depletion layer of different thickness from other GM-APDs;
   a common cathode contact for said plurality of GM-APDs and comprising a first connection lead on the backside of said semiconductor substrate;
   a second connection lead; and
   said metallization layer comprising a common anode collecting grid contact and configured to couple in common said anode contacts of said plurality of GM-APDs to said second connection lead;
   said plurality of GM-APDs configured to
      multiplex output information produced thereby, and
      generate, when a photon impinges thereon, current pulses of different shape for discrimination by an external circuit to be coupled to said common cathode contact and said anode collecting grid contact.

2. The multi-pixel photo detector array of claim 1 wherein the physical characteristic further comprises a respective different quenching resistor for each GM-APD.

3. The multi-pixel photo detector array of claim 2 wherein a resistance value of each quenching resistor is between 100 kΩ and 3 MΩ.

4. The multi-pixel photo detector array of claim 2 wherein each respective different quenching resistor includes a polycrystalline silicon layer with a dopant concentration ranging from 1e17 to 1e21 atoms/cm$^3$; and wherein said common cathode contact is defined at least partially on the polycrystalline silicon layer.

5. A multi-pixel photodetector array comprising:
   a semiconductor substrate having a backside and a front side;
   a plurality of Geiger mode avalanche photodiodes (GM-APDs) on said semiconductor substrate, each GM-APD comprising an anode contact, and having a physical characteristic different from other GM-APDs and a position on said semiconductor substrate, the physical characteristic comprising a depletion layer of different thickness from other GM-APDs;
   a common cathode for said plurality of GM-APDs on the backside of said semiconductor substrate; and
   a common anode on the front side of said semiconductor substrate and configured to couple in common said anode contacts of said plurality of GM-APDs;
   each GM-APD configured to generate, when a photon impinges thereon, a current pulse of different shape for discrimination by an external circuit to be coupled to said common cathode and said common anode.

6. The multi-pixel photo detector array of claim 5 wherein said plurality of GM-APDs is configured to perform imaging applications with monochromatic radiation.

7. The multi-pixel photo detector array of claim 5 wherein the physical characteristic further comprises a respective different quenching resistor for each GM-APD.

8. The multi-pixel photo detector array of claim 7 wherein a resistance value of each quenching resistor is between 100 kΩ and 3 MΩ.

9. The multi-pixel photo detector array of claim 7 wherein each respective different quenching resistor includes a polycrystalline silicon layer with a dopant concentration ranging from 1e17 to 1e21 atoms/cm$^3$; and wherein said common cathode contact is defined at least partially on the polycrystalline silicon layer.

10. The multi-pixel photo detector array of claim 5 wherein each anode contact comprises a metal contact.

11. The multi-pixel photo detector array of claim 5 wherein said anode comprises a collecting grid anode.

12. A method of operating a multi-pixel photodetector array comprising a semiconductor substrate having a backside and a front side, a plurality of Geiger mode avalanche photodiodes (GM-APDs) on the semiconductor substrate, each GM-APD comprising an anode contact, and having a physical characteristic different from other GM-APDs and a position on the semiconductor substrate, the physical characteristic comprising a depletion layer of different thickness from other GM-APDs, a common cathode for the plurality of GM-APDs and comprising a first connection lead on the backside of the semiconductor substrate, and a common anode on the front side of the semiconductor substrate and to couple in common the anode contacts of the plurality of GM-APDs to a second connection lead, the method comprising:
   based upon the physical characteristic, each GM-APD generating, when a photon impinges thereon, a current pulse of different shape for discrimination; and
   discriminating, with an external circuit coupled to the common cathode and the common anode, based upon the position and the physical characteristic of each GM-APD and correlating a respective current pulse of different shape to a respective GM-APD.

13. The method of claim 12 wherein the plurality of GM-APDs perform imaging applications with monochromatic radiation.

14. The method of claim 12 wherein each GM-APD uses a quenching resistor different from the other GM-APDs.

15. The method of claim 14 wherein a resistance value of each quenching resistor is between 100 kΩ and 3 MΩ.

16. The method of claim 15 wherein each GM-APD includes a polycrystalline silicon layer with a dopant concentration ranging from 1e17 to 1e21 atoms/cm$^3$, the polycrystalline silicon layer defining the quenching resistor of the GM-APD; and wherein the common cathode is defined at least partially on the polycrystalline silicon layer.

17. The method of claim 12 wherein each anode contact comprises a metal contact.

18. The method of claim 12 wherein the anode comprises a collecting grid anode.

19. A method of making a multi-pixel photodetector array comprising:
   forming a semiconductor substrate having a backside and a front side;
   forming a plurality of Geiger mode avalanche photodiodes (GM-APDs) on the semiconductor substrate, each GM-APD comprising an anode contact, and having a physical characteristic different from other GM-APDs and a position on the semiconductor substrate, the physical characteristic comprising a depletion layer of different thickness from other GM-APDs;

forming a common cathode for the plurality of GM-APDs on the backside of the semiconductor substrate; and forming a common anode on the front side of the semiconductor substrate and configured to couple in common the anode contacts of the plurality of GM-APDs;

each GM-APD to generate, when a photon impinges thereon, a current pulse of different shape for discrimination by an external circuit to be coupled to the common cathode and the common anode.

20. The method of claim 19 wherein the physical characteristic further comprises a respective different quenching resistor for each GM-APD.

* * * * *